(12) United States Patent
Kröninger et al.

(10) Patent No.: US 7,708,854 B2
(45) Date of Patent: May 4, 2010

(54) WORK CARRIER AND METHOD OF PROCESSING A WORKPIECE

(75) Inventors: Werner Kröninger, Vilshofen/Albersdorf (DE); Günter Lang, Nürnberg (DE)

(73) Assignee: Infineon Technologies AG, Munich (DE)

( * ) Notice: Subject to any disclaimer, the term of this patent is extended or adjusted under 35 U.S.C. 154(b) by 0 days.

(21) Appl. No.: 10/729,882

(22) Filed: Dec. 5, 2003

(65) Prior Publication Data

US 2004/0231793 A1  Nov. 25, 2004

(30) Foreign Application Priority Data

Dec. 20, 2002  (DE) ................... 102 60 233

(51) Int. Cl.
B32B 38/10 (2006.01)
B32B 37/10 (2006.01)
B32B 7/12 (2006.01)

(52) U.S. Cl. .............. 156/247; 156/285; 156/344; 428/317.1; 438/464; 438/977

(58) Field of Classification Search ................ 156/344, 156/584, 247, 285; 428/304.4, 317.1; 438/464, 438/976, 977
See application file for complete search history.

(56) References Cited

U.S. PATENT DOCUMENTS

| | | | |
|---|---|---|---|
| 3,865,359 A | | 2/1975 | Caroli |
| 4,466,852 A | * | 8/1984 | Beltz et al. ................. 156/344 |
| 4,906,011 A | * | 3/1990 | Hiyamizu et al. ............ 279/3 |
| 5,883,522 A | | 3/1999 | O'Boyle |
| 5,908,722 A | * | 6/1999 | Burke et al. ................. 430/22 |
| 5,927,193 A | * | 7/1999 | Balz et al. .................. 101/129 |
| 6,032,715 A | | 3/2000 | Ohkubo et al. |
| 6,470,946 B2 | * | 10/2002 | De ........................... 156/584 |
| 6,827,809 B2 | * | 12/2004 | Anker ....................... 156/249 |
| 2002/0078559 A1 | * | 6/2002 | Buchwalter et al. ......... 29/832 |
| 2002/0112331 A1 | * | 8/2002 | Yamada ..................... 29/33.5 |
| 2002/0173121 A1 | | 11/2002 | Ohya et al. |

FOREIGN PATENT DOCUMENTS

| | | |
|---|---|---|
| DE | 1 291 698 | 4/1965 |
| DE | 2258007 | 11/1973 |
| DE | 79 22 341 | 11/1979 |
| DE | 87 03 223.6 | 5/1987 |
| DE | 199 29 617 A | 6/1999 |

(Continued)

OTHER PUBLICATIONS

Translation of Notice of Reasons for Refusal; Tokugan 2003-424295; Sep. 12, 2006.

(Continued)

Primary Examiner—Mark A Osele
(74) Attorney, Agent, or Firm—Brinks Hofer Gilson & Lione

(57) ABSTRACT

Explained, inter alia, is a method in which a workpiece (52) to be processed is fastened to a work carrier (10) by means of a solid (62). The work carrier (10) is made of a porous material, e.g. of porous ceramic. This processing method permits simple manipulation of the wafer during the processing. In addition, the workpiece (52) can be easily separated from the work carrier (10) using a solvent.

18 Claims, 2 Drawing Sheets

FOREIGN PATENT DOCUMENTS

| | | |
|---|---|---|
| DE | 299 09 410 U1 | 6/1999 |
| JP | 56-172941 | 12/1981 |
| JP | 59-17159 | 2/1984 |
| JP | 59-209756 | 11/1984 |
| JP | 61-50631 | 4/1986 |
| JP | 06-005569 | 1/1994 |
| JP | 2001-121413 | 5/2001 |
| JP | 2002-184845 | 6/2002 |
| JP | 2002-343751 | 11/2002 |

OTHER PUBLICATIONS

Japanese Office action dated Sep. 25, 2007, Translation of Notice of Reasons for Refusal, Patent Application No. 2003-424295.

German Office Action Dated Nov. 24, 2008—(with translation).

* cited by examiner

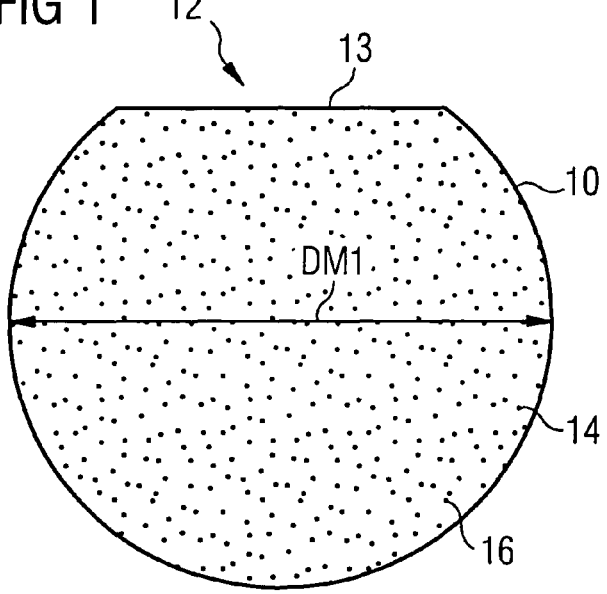
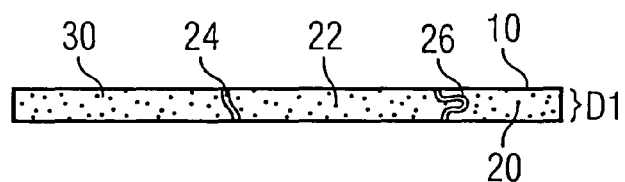
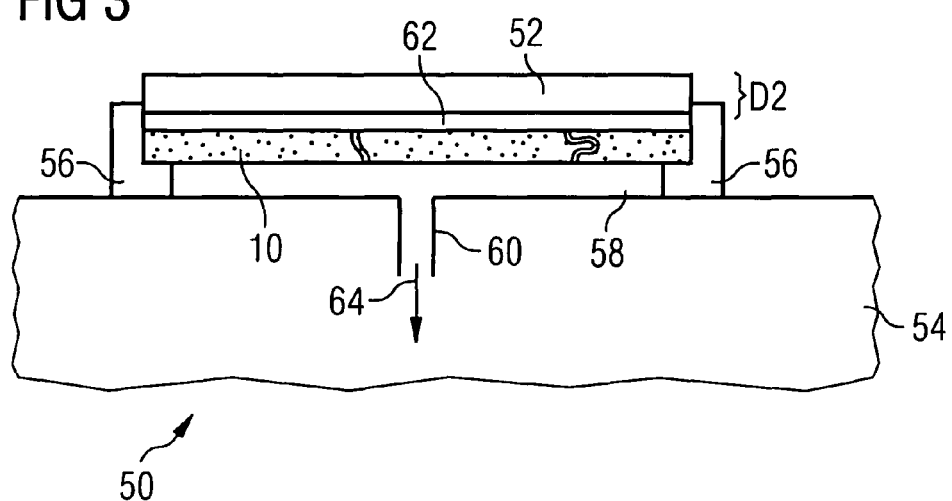

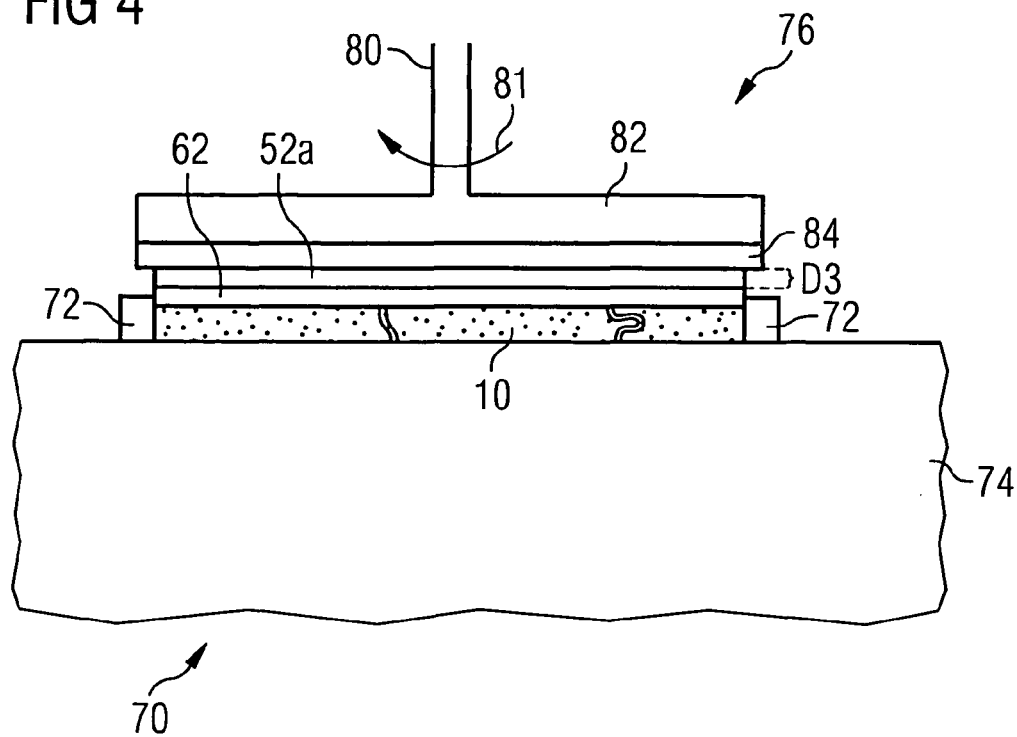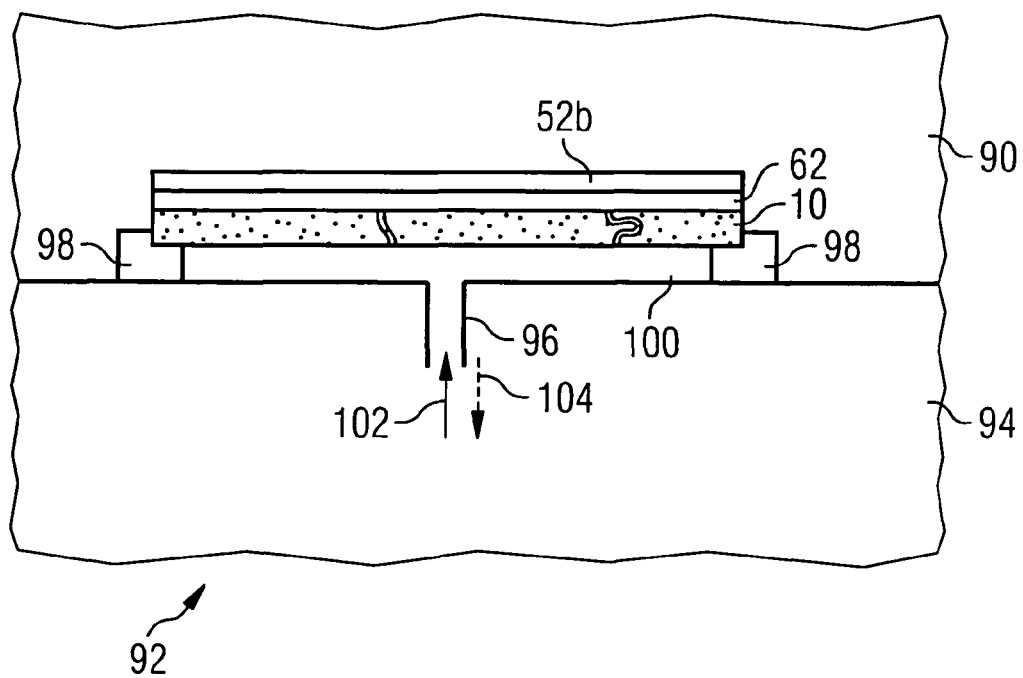

WORK CARRIER AND METHOD OF PROCESSING A WORKPIECE

FIELD OF THE INVENTION

The invention relates to a method in which a workpiece to be processed is fastened to a work carrier by means of a solid.

BACKGROUND OF THE INVENTION

The workpiece is, for example, a semiconductor disk, i.e. a "wafer". Thus very thin semiconductor disks are to be processed or they are to be produced from thicker semiconductor disks. When SOI technology (silicon on insulator) is used, the thickness of the thinned semiconductor disk or of another substrate, e.g. made of glass or ceramic, is, for example, less than 20 µm (micrometers).

The solid used is, for example, an adhesive or wax. The workpiece and work carrier are thus held together on account of the adhesion forces between the solid and the workpiece or the work carrier and on account of the cohesion forces in the solid.

A problem with such methods is, for example, the uniform application of the solid, in particular having a planar surface, to which the workpiece can then be applied so as to lie in one plane. But problems, e.g. workpiece fractures, also occur during the separation of the workpiece from the work carrier. If the workpiece is to be released especially carefully, the time required for the separation is considerably prolonged as a rule.

SUMMARY OF THE INVENTION

One object of the invention, for processing a workpiece, is to specify a simple method which permits in particular uniform application of the solid and in particular simple separation of workpiece and work carrier. In addition, a work carrier is to be specified which is used in particular in this method.

The object related to the method is achieved by the method steps specified in patent claim 1. Developments are specified in the subclaims.

The invention is based on the idea that the work carrier should be made of or contain a material which, on the one hand, promotes the connection of workpiece and work carrier by means of a solid and which, on the other hand, also permits the separation of workpiece and work carrier in a simple manner. In the method according to the invention, a work carrier is therefore used which contains a porous material or is even made of a porous material. Porous means that the work carrier contains a multiplicity of cavities in the interior and also at its surface. These cavities are also referred to as pores. A porous surface, compared with a smooth surface, has improved adhesion properties for the solid. In addition, a large number of porous materials are available, so that suitable porous materials can be selected.

In a development of the method according to the invention, a gas-permeable work carrier is used. The gas flows through passages from pores connected to one another or from elongated pores. In the development, a vacuum is generated at the work carrier when the workpiece is fastened to the work carrier, and this vacuum promotes the adhesion. Thus, in a refinement, a vacuum is generated after the application of the solid in liquefied form and before it has hardened. The vacuum sucks the solid into initial sections of the pore passages. Depending on the viscosity of the solid, the vacuum does not have to be maintained for the entire hardening time, but, for example, only at the start of the hardening.

Due to the suction, the solid is uniformly distributed in a simple manner. Air bubbles are drawn off, so that adhesion over the entire surface is achieved.

The vacuum is preferably set in such a way that the penetration depth of the liquefied solid does not exceed the average pore width. The adhesion between solid and work carrier is increased by this measure. Nonetheless, the adhesive can easily be released again from the work carrier.

In a next development of the method according to the invention, the solid for separating the workpiece and work carrier is released by means of a solvent, for example by means of an organic solvent such as acetone, alcohol, ether or isopropanol. On account of the pores, the release of the solid from the work carrier and thus also of the workpiece from the work carrier is promoted, in particular also by pores which adjoin the solid and are connected to one another by passages. The passages may also be formed by elongated pores which lie in the work carrier so as to start from the solid and end again at the solid. The release is accelerated as soon as there are pores under the solid which are not completely filled with the solid or are connected via pore passages to other pores which adjoin the solid.

In a next development, a work carrier which is permeable to the solvent is used. This means that there are passages in the porous work carrier which are formed by pores connected to one another or by elongated pores, in which passages the solvent is transported, for example by capillary action or by the generation of a positive pressure or of a vacuum. In a refinement, the passages run from that side of the work carrier which adjoins the solid right up to that side of the work carrier which is remote from the side which adjoins the solid. Branches of these passages lead if need be to side surfaces of the work carrier. In particular, work carriers having a branched pore network are used.

In a next development, the porous material is a ceramic, a glass, a glass ceramic, a metal, in particular a sintered metal, or a metal ceramic. Sintered metals are generally suitable. The pore formation can be promoted during the manufacture of these materials by material particles which burn out during manufacture being added. The materials used in the method according to the invention are also referred to as porous materials, e.g. as porous ceramic or porous glass.

In a refinement, the average pore size has a value of between 20 µm and 500 µm, preferably between 50 µm and 100 µm. Pore diameters lying within the last mentioned range form passages having a good capillary action.

In a next development, the porosity of the porous material has a value of between 20% and 50%. In this case, the porosity indicates the ratio of the pore volume to the total volume of the material including the total pore volume. This provides a good compromise between the number of pores and the remaining stability of the work carrier.

In a next development, the value of the open porosity of the porous material lies between 10% and 600, in particular between 20% and 50%. In this case, the open porosity indicates the ratio of the volume of those pores which are connected via a pore passage to the margin of the porous material or which lie at the surface of the porous material to the total volume including the total pore volume. There is no distinction made in this case as to whether the pore passages run continuously or on one side, i.e. "blind passages". This ranges provide a good compromise between increased adhesion of the solid on the work carrier, between easy solubility and between sufficient stability of the work carrier.

In another refinement, at least 10% or at least 20% of the pore volume belongs to pore passages which pass through the porous material. In this refinement, it is ensured that solvent is brought up to the solid to a sufficient extent.

In another refinement, the porous materials used are the ceramics according to DIN (German Institute of Standardization) EN (European Standard) 623-2, 1992 or DIN 51056, 1985. For example, P65 or P55 ceramics are used, which, inter alia, are produced by the company "Rauschert technisches Glas".

In a next development, the pores are arranged irregularly and according to a uniform distribution. In contrast to fine bores arranged in a grid, in addition to the reduced cost of manufacture, a homogeneous distribution of the pores is also obtained, this homogeneous distribution promoting the connection of workpiece and work carrier or the separation of workpiece and work carrier.

In a next development, the workpiece fastened to the work carrier is thinned during the processing, in particular to a thickness less than 100 µm or less than 20 µm. For example, a grinding process is carried out in which the rate of material removal is greater than 1 µm/s, for example 3 µm/s. In addition, the workpiece is then dry polished or polished using a CMP process (chemical mechanical polishing). In this case, the rate of material removal is, for example, around 1 µm/min. Instead of polishing, etching is also carried out over the entire surface, e.g. using a dry-chemical, a wet-chemical or a chemical process, e.g. plasma etching or reactive ion etching. The workpiece thinned in such a way, e.g. a wafer, is then subjected, for example, to a lithographic process. Layer deposition can also be carried out on the thinned workpiece in order to produce semiconductor components or conducting paths. During these processing steps, a thinned workpiece can also be manipulated like a workpiece having the original thickness, in particular transported, inserted into or clamped in place in the processing machines and removed from the processing machines.

In addition to the abovementioned adhesive or wax, the solid used, in a next development, is a plastic material or a double-sided adhesive tape.

In a development, the solid fills the entire intermediate space between workpiece and work carrier in a simple manner. Alternatively, the solid fills only part of the intermediate space between workpiece and work carrier, for example a plurality of regions separated from one another by intermediate spaces or an annular region which surrounds a region which is not filled. The release is further facilitated by the partial filling.

In a further aspect, the invention relates to a work carrier which has the shape of a plate or a disk. The work carrier contains a porous material or is made of a porous material. The abovementioned technical effects thus likewise apply to the work carrier. In particular, in developments, the work carrier has features of a work carrier used in the method according to the invention or in its developments. The work carrier can in particular be reused and serves to facilitate the holding, transporting or manipulating of even a thinned workpiece.

In a development, the work carrier has the outline of a semiconductor wafer, that is to say it also has if need be a "flat", i.e. a flattening for identifying the crystal direction. The diameter of the work carrier is equal to the diameter of a semiconductor wafer, i.e. equal to 1" (1 inch=25.4 mm), 2", etc., right up to a diameter of 12" or 13", etc. The selection of such a diameter ensures that there is no projecting margin of the semiconductor wafer. The work carrier also does not project beyond the semiconductor wafer. This would make it difficult, for example, to generate a vacuum.

BRIEF DESCRIPTION OF THE DRAWINGS

Developments of the method according to the invention are explained below with reference to the figures. In the drawing:

FIG. 1 shows a plan view of a work carrier,

FIG. 2 shows a sectional view of the work carrier,

FIG. 3 shows the fastening of a semiconductor wafer to the work carrier,

FIG. 4 shows the thinning of the semiconductor wafer fastened to the work carrier, and FIG. 5 shows the separation of semiconductor wafer and work carrier by means of a solvent.

DETAILED DESCRIPTION OF THE DRAWINGS

FIG. 1 shows a plan view of a work carrier 10 of ceramic RAPOR P65. The work carrier 10 has the shape of a disk with a diameter DM1 of 12" (1 inch=25.4 mm), i.e. about 300 mm. The work carrier 10 is flattened on one side 12 in order to simulate a flat of the wafer to be fastened to the work carrier. The work carrier 10 contains a multiplicity of pores 14, 16 which lie at the surface to which the wafer is to be fastened.

FIG. 2 shows a sectional view of the work carrier 10. In the exemplary embodiment, a thickness D1 of the work carrier 10 is 770 µm (micrometers). This thickness corresponds to the thickness of a 12" silicon wafer. A multiplicity of pores 20, 22 also lie in the interior of the work carrier 10. Adjacent pores are interconnected in the interior of the work carrier 10 to form a multiplicity of pore passages 24, 26 which run from the top side 30, i.e. the side for fastening the wafer, right up to the rear side 32 of the work carrier 10. The pore passage 24 is comparatively rectilinear, whereas the pore passage 26 runs in a meander shape.

FIG. 3 shows a sectional view through a holding device 50 which serves to connect a semiconductor wafer 52 to the work carrier 10. The holding device 50 contains a base plate 54, on which a holding ring 56 is fastened. In its top part, the holding ring 56 has an inside diameter which corresponds to the diameter DM1. In its bottom part, the holding ring 56 has a slightly smaller diameter, so that a bearing surface for the work carrier 10 is formed. A chamber 58 is produced between the work carrier 10 resting on the holding ring 56 and the base plate 54. Arranged in the center of the chamber 58 in the base plate 54 is a suction passage 60, which is connected to a vacuum pump.

After the work carrier 10 has been put onto the holding ring 56, the top side 30 of the work carrier 10 is coated with an adhesive, e.g. with an adhesive on an epoxy resin basis. After the adhesive 62 has been applied, the vacuum pump is switched on and a vacuum is generated in the chamber 58, see arrow 64. By means of the vacuum, the adhesive 62 is sucked into the pores on the top side 30, e.g. into the pores 14 and 16, and into the initial sections of the pore passages 24 and 26. With the vacuum continuing to be maintained, a 12" semiconductor wafer 52 having a thickness D2 of 750 µm is then put onto the adhesive coating 62 and pressed on lightly if need be. The vacuum pump is switched off after the adhesive 62 has hardened.

In the exemplary embodiment, the height of the holding ring 56 is dimensioned in such a way that the side surfaces of the work carrier 10 and of the adhesive 62 are completely covered and the side surface of the semiconductor wafer 52 is partly covered. Due to this measure, if a sealing material for the holding ring 56 is suitably selected, no secondary air is drawn, so that the semiconductor wafer 52 is drawn uniformly onto the adhesive 62. In FIG. 3, the coating of adhesive 62 is shown greatly enlarged compared with the coating thickness of the work carrier 10 or of the semiconductor wafer 52.

After the hardening, the semiconductor wafer 52 fastened to the work carrier 10 is removed from the holding device 50 and transported to a grinding machine by means of a transport device, e.g. a wafer cassette. By means of the grinding machine, the semiconductor wafer 52 is thinly ground from 750 μm to 105 μm. During the grinding, the semiconductor wafer 52 is held on the work carrier 10 in a holding device. After the grinding, the thinned semiconductor wafer 52 is transported to a CMP machine 70 (chemical mechanical polishing) shown in FIG. 4 and is inserted there into a holding ring 72.

As shown in FIG. 4, the holding ring 72 is fastened on a base plate 74 of the CMP machine 70. By means of a grinding tool 76 and a polishing means (slurry) (not shown), the semiconductor wafer 52 is thinned by 5 μm for example. The thickness of the thinned semiconductor wafer 52a is then 100 μm. The grinding tool 76 contains a drive shank 80, which is rotated in a direction shown by a direction of rotation arrow 81, a grinding disk 82 and a polishing cloth 84 fastened to the grinding disk 82.

In an alternative exemplary embodiment, the work carrier 10 is held in the CMP machine 70 by means of a vacuum. In this case, the holding device of the CMP machine 70 is constructed like the holding device 50, i.e. there are again lateral seals, a stepped holding surface in the holding ring, and at least one suction passage.

After the thinning of the semiconductor wafer 52a, a number of further method steps can be carried out on the semiconductor wafer 52a connected to the work carrier 10, a multiplicity of transistors being produced, for example, on the semiconductor wafer 52a. A semiconductor wafer 52b is obtained.

As shown in FIG. 5, the semiconductor wafer 52b, after these method steps, is removed by means of a liquid solvent 90 which is located in a tank 92. The tank 92 has a base 94 through which a through passage 96 passes. Fastened concentrically around the through-passage 96 on the base plate 94 is a holding ring 98, which, like the holding rings 56 and 72, also follows the course of the margin of the work carrier 10, i.e. it simulates in particular a flat 13. In the top region, the holding ring 98 has a diameter which corresponds to the diameter DM1. In its bottom region, it has a smaller diameter, so that a bearing surface for the work carrier 10 is produced. A chamber 100, into which solvent is pumped through the through-passage 96, see arrow 102, is formed between the work carrier 10 and the base plate 94 by the holding ring 98. The solvent passes through the pore passages 24 and 26 right up to the adhesive 62. The top edge of the holding ring 98 extends only approximately halfway up the side wall of the work carrier 10, so that solvent can escape at the sides into the tank 92. The escaped solvent then penetrates from outside into the adhesive joint filled with adhesive 62 and further accelerates the solvation process. In another exemplary embodiment, the solvent is drawn off through the through-passage 96, see arrow 104. In this case too, solvent passes out of the tank 92 through the pore system in the work carrier 10 up to the top side of the work carrier 10 to the adhesive coating 62.

In another exemplary embodiment, before the semiconductor wafer 52b is released from the work carrier 10, a further work carrier is fastened to the exposed side of the semiconductor wafer 52b, this further work carrier thus being designed like the work carrier 10. In this case the processing of the semiconductor wafer 52b can now be continued on its rear side.

By the method steps explained with reference to FIGS. 1 to 5, processing is carried out in a simple manner, and this processing can be carried out with high efficiency, in particular with low fracture rates and without other damage. The time for the release process is very short. In addition, the work carrier 10, i.e. the ceramic plate, can immediately be reused after the release of the semiconductor wafer 52b.

The invention claimed is:

1. A method of processing a workpiece, the method comprising the steps of:
    applying a liquid adhesive to a work carrier,
    wherein a diameter of the work carrier is substantially equal to a diameter of the workpiece, and
    wherein the work carrier comprises a porous material including a plurality of pores at least a portion of which are interconnected, wherein a portion of the plurality of pores include pore passages that comprise at least 10% of the pore volume, and wherein the pore passages traverse the porous material from a top side to a backside of the work carrier;
    applying a vacuum pressure to the work carrier,
    wherein the plurality of pores accommodate a portion of the liquefied solid upon application of the vacuum pressure to the work carrier;
    placing the workpiece in intimate contact with the liquefied adhesive;
    hardening the liquefied adhesive while maintaining the vacuum pressure to form a solid adhesive and to secure the workpiece to the work carrier,
    processing the workpiece while holding the workpiece on the work carrier; and
    applying a solvent through the plurality of pores to dissolve the solid adhesive and to release the workpiece from the work carrier.

2. The method as claimed in claim 1, wherein the work carrier comprises a gas-permeable work carrier.

3. The method as claimed in claim 1, wherein the solid functions to separate the workpiece and the work carrier.

4. The method as claimed in claim 1, wherein the porous material comprises a ceramic, a glass, a glass ceramic, a metal, a sintered metal, a metal ceramic or a sintered material.

5. The method as claimed in claim 1, wherein processing the workpiece comprises thinning the workpiece on the work carrier.

6. The method as claimed in claim 1, wherein the liquefied adhesive comprises a material selected from a group consisting of: wax, an epoxy resin, a plastic material, or adhesive on a double-sided adhesive tape.

7. The method as claimed in claim 1, wherein the workpiece contains a semiconductor material.

8. The method as claimed in claim 1, wherein the liquid adhesive fills at least a portion of an intermediate space between the workpiece and the work carrier.

9. The method of claim 1 wherein, applying a solvent to release the workpiece from the work carrier comprises penetrating the solvent into passages from a pore or from the plurality of pores through the work carrier up to the liquefied solid.

10. The method of claim 1, wherein releasing the workpiece from the work carrier further comprises releasing the workpiece by generating a positive pressure on a backside of the work carrier.

11. The method as claimed in claim 1, wherein the porous material comprises a porous material having average pore size of between 20 μm and 500 μm, and a porosity of between 20% and 50%.

12. The method as claimed in claim 1, wherein the porous material comprises a porous material having an open porosity of between 10% and 60%.

13. The method as claimed in claim 1, wherein the porous material comprises a ceramic material manufactured according to one of German Institute Standard DIN 51056, 1985 or European Standard 623-2, 1992, and wherein the pores are arranged irregularly.

14. The method as claimed in claim 1, wherein the porous material comprises a porous material having an average pore size ranging from 50 µm to 100 µm.

15. The method as claimed in claim 1, wherein the porous material comprises a porous material having an open porosity of between 20% and 50%.

16. The method as claimed in claim 1, wherein a perimeter configuration of the work carrier is substantially the same as a perimeter configuration of the work piece.

17. The method as claimed in claim 1, wherein the workpiece comprises a semiconductor wafer having a flat section on a perimeter thereof, and wherein a perimeter of the work carrier has a corresponding flat section.

18. In combination, a work carrier and workpiece, the combination comprising:
   a porous material including a plurality of pores at least a portion of which are interconnected, wherein a portion of the plurality of pores include pore passages that comprise at least 10% of the pore volume, and wherein the pore passages traverse the work carrier from a top side to a rear side of the work carrier
   wherein the workpiece comprises a semiconductor wafer attached to the workcarrier by an adhesive, wherein the diameter of the work carrier is substantially equal to the diameter of the semiconductor wafer,
   wherein, upon application of vacuum pressure to the work carrier, the plurality of pores are configured to accommodate a portion of the adhesive in a liquid state, and to accommodate the liquefied adhesive upon hardening of the adhesive to a solid,
   wherein the plurality of pores are further configured to provide for flow of a solvent therethrough to dissolve the solid adhesive and release the semiconductor wafer.

* * * * *